(12) United States Patent
Sasaki et al.

(10) Patent No.: US 8,664,775 B2
(45) Date of Patent: Mar. 4, 2014

(54) SEMICONDUCTOR DEVICE

(75) Inventors: Kenichi Sasaki, Sendai (JP); Norio Fukasawa, Sendai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/553,084

(22) Filed: Jul. 19, 2012

(65) Prior Publication Data

US 2013/0032942 A1 Feb. 7, 2013

(30) Foreign Application Priority Data

Aug. 3, 2011 (JP) .................. 2011-170422

(51) Int. Cl.
*H01L 23/48* (2006.01)

(52) U.S. Cl.
USPC ............ 257/784; 257/E23.069; 257/E23.01

(58) Field of Classification Search
CPC ............ H01L 2824/01079; H01L 2924/14; H01L 2924/01013
USPC ............ 257/738, 784, E23.069, E23.01
See application file for complete search history.

(56) References Cited

U.S. PATENT DOCUMENTS 6,333,562 B1 * 12/2001 Lin ............................. 257/777
6,340,846 B1 * 1/2002 LoBianco et al. ............ 257/783
7,037,756 B1 * 5/2006 Jiang et al. ................... 438/109
7,443,037 B2 * 10/2008 Kim et al. ..................... 257/777
2001/0012643 A1 * 8/2001 Asada .......................... 438/107
2002/0096785 A1 * 7/2002 Kimura ........................ 257/778
2002/0125556 A1 * 9/2002 Oh et al. ...................... 257/685
2003/0127719 A1 * 7/2003 Chang ......................... 257/685
2006/0115930 A1 * 6/2006 Ogata ........................... 438/109
2008/0237898 A1 * 10/2008 Yano et al. ................... 257/796

FOREIGN PATENT DOCUMENTS

JP  08-250628 A  9/1996
JP  2009-194189 A  8/2009

* cited by examiner

*Primary Examiner* — Nikolay Yushin
(74) *Attorney, Agent, or Firm* — Westerman, Hattori, Daniels & Adrian, LLP

(57) ABSTRACT

A semiconductor device includes a circuit substrate, a first semiconductor chip disposed on the circuit substrate, a plurality of first spacers disposed on the first semiconductor chip, a second semiconductor chip which includes a first adhesive agent layer on a lower face thereof and is disposed on upper portions of the plurality of spacers, a wire which connects the circuit substrate to the first semiconductor chip, and a first sealing material which seals a gap between the first semiconductor chip and the first adhesive agent layer, wherein each height of the plurality of the first spacers is greater than height of the wire relative to an upper face of the first semiconductor chip.

9 Claims, 17 Drawing Sheets

SEMICONDUCTOR DEVICE

CROSS-REFERENCE TO RELATED APPLICATIONS

This application is based upon and claims the benefit of priority of the prior Japanese Patent Application No. 2011-170422, filed on Aug. 3, 2011, the entire contents of which are incorporated herein by reference.

FIELD

The embodiments discussed herein is related a semiconductor device and a manufacturing method therefor.

BACKGROUND

A semiconductor device is formed by sealing an integrated circuit chip (semiconductor chip) mounted on a package substrate (hereafter simply referred to as substrate) with an epoxy resin etc. Normally, the number of integrated circuit chips included in the semiconductor device is one.

However, in recent years, there has been developed a stacked IC (integrated circuit) having a plurality of integrated circuit chips mounted on a substrate. The stacked IC is a semiconductor device having integrated circuit chips and flat plate-shaped spacers (of mono-crystal silicon, for example) stacked alternately.

The stacked IC is formed by that adhesive layers disposed on the each rear face of integrated circuit chips and the spacers are adhered (attached) to members (integrated circuit chips or spacers) on the lower side. (For example, Japanese Laid-open Patent Publication NO. 2009-194189)

SUMMARY

According to an aspect of the embodiments, a semiconductor device includes a circuit substrate, a first semiconductor chip disposed on the circuit substrate, a plurality of first spacers disposed on the first semiconductor chip, a second semiconductor chip which includes a first adhesive agent layer on a lower face thereof and is disposed on upper portions of the plurality of spacers, a wire which connects the circuit substrate to the first semiconductor chip, and a first sealing material which seals a gap between the first semiconductor chip and the first adhesive agent layer, wherein each height of the plurality of the first spacers is greater than height of the wire relative to an upper face of the first semiconductor chip.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 6A-6D are process cross sections illustrating the manufacturing method of the semiconductor device according to the embodiment 1;

DESCRIPTION OF EMBODIMENTS

The adhesive layer for use in the stacked IC is an adhesive film (die attach film or the like), for example. Compatibility between such the adhesive layer and the integrated circuit chip is not excellent as compared to that between a sealing material (mold resin) and the integrated circuit chip. Therefore, various problems may occur if the adhesive layer is attached on the surface of the integrated circuit chip.

For example, when the semiconductor device is heated by a reflow process, stress is produced because of the difference in thermal expansion coefficients between the integrated circuit chip and the adhesive layer. At this time, the produced stress is concentrated at the surface of the integrated circuit chip, because of the difference in elastic coefficients between both members. This may cause broken wiring in the integrated circuit chip. A similar problem may occur in case of laminating a heat sink etc. on the integrated circuit chip using the adhesive layer.

Also, when the pitch of bonding wires connected to the integrated circuit chip are narrow, the bonding wires are displaced to contact to each other easily due to an injection of a resin at the time of molding.

According to the embodiments, it is possible to prevent problems caused by the adhesive layer attached to the surface of the integrated circuit chip.

Embodiment 1

(1) Structure

Figure 1:
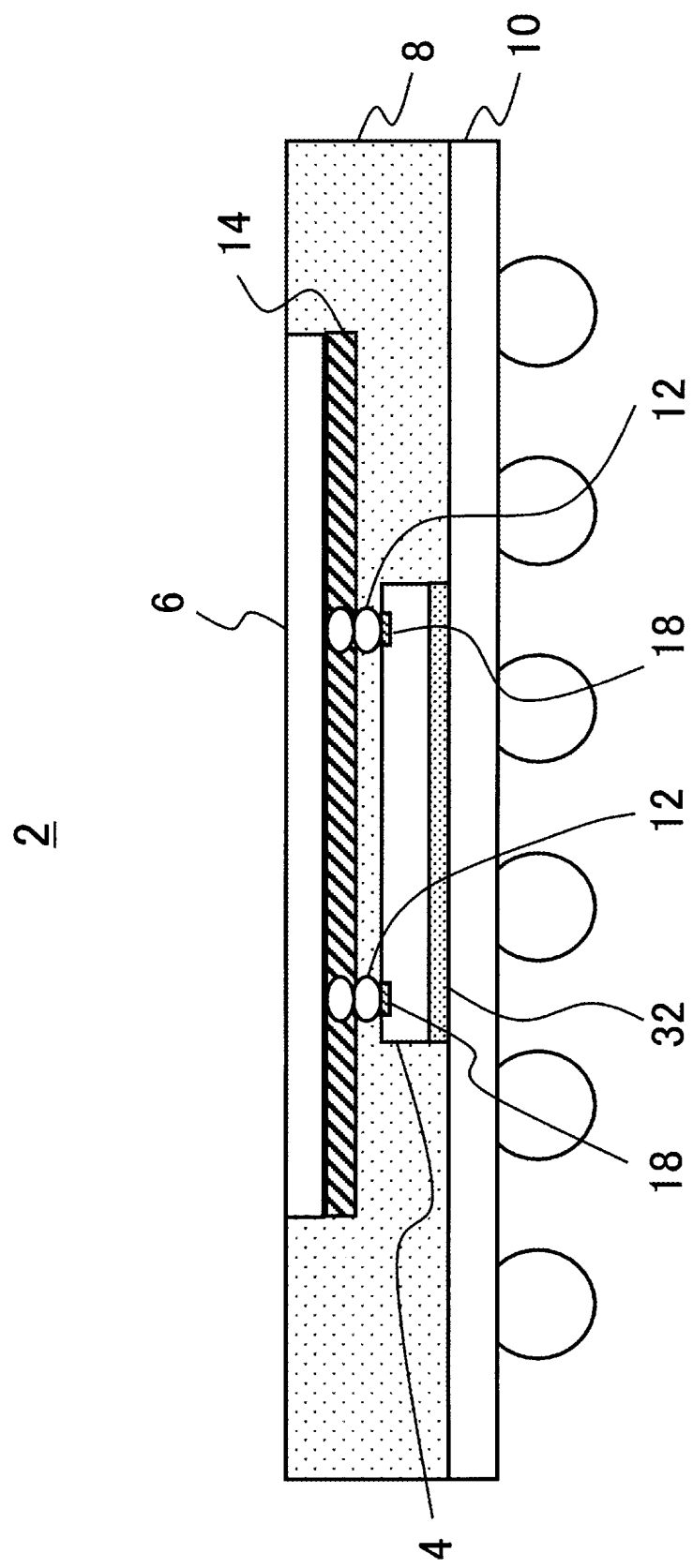
FIG. 1 illustrates a cross section of a semiconductor device according to the embodiment 1.
Figure 2:
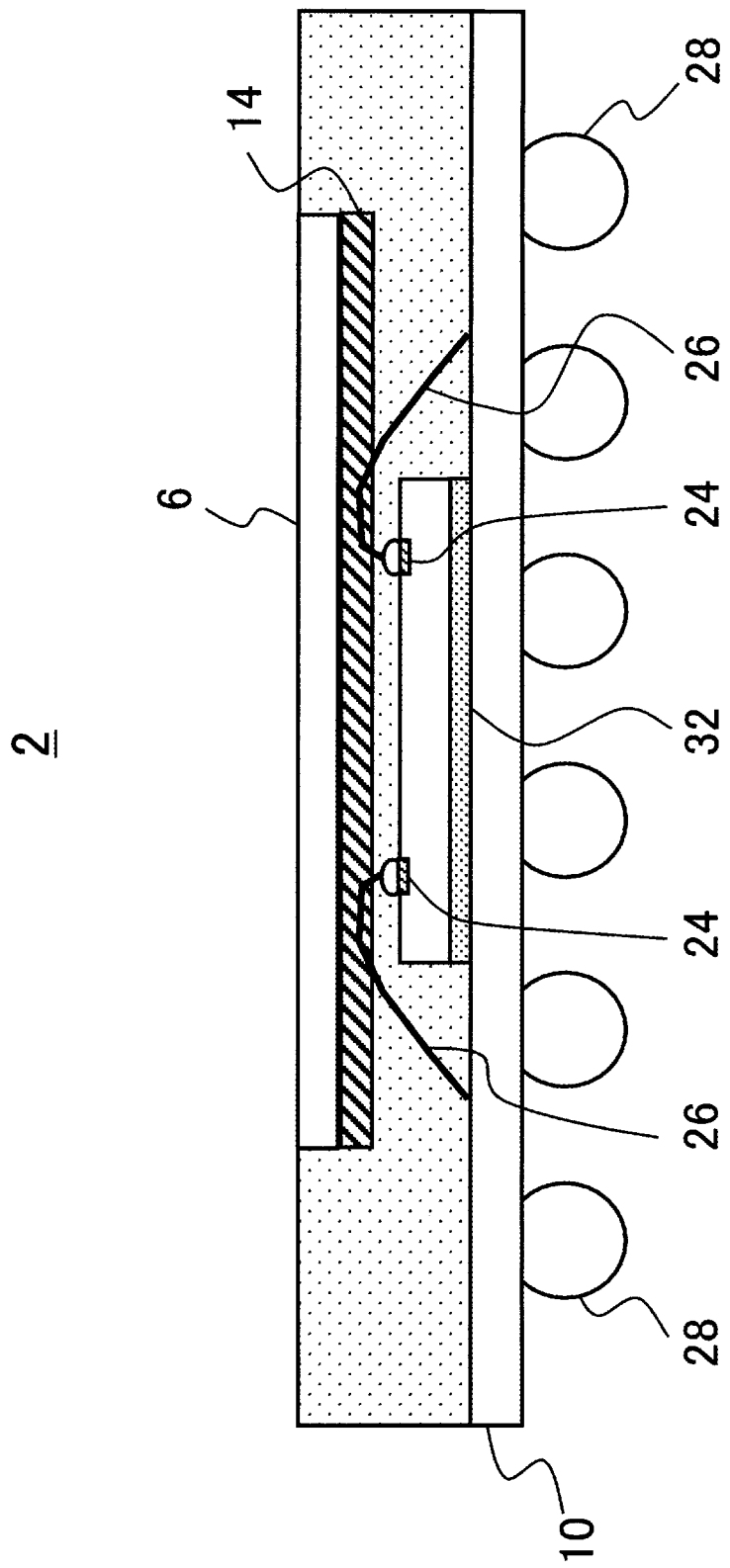
FIG. 2 illustrates a cross section of a semiconductor device according to the embodiment 1.
Figure 3:
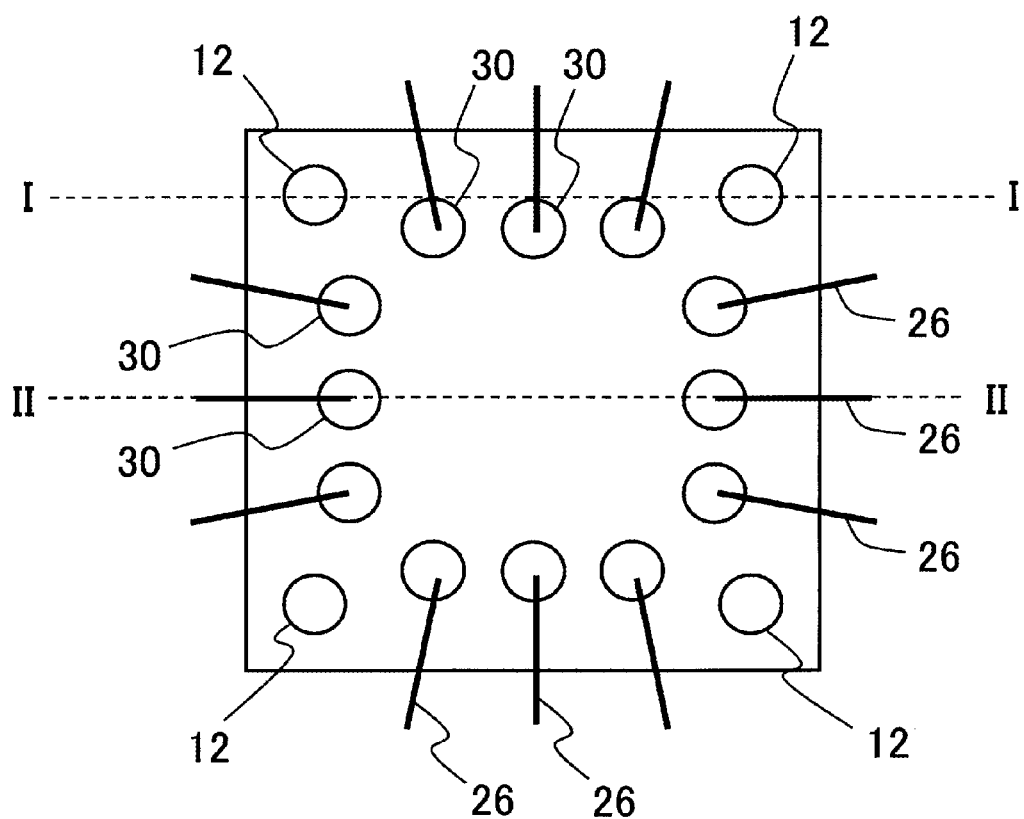
FIG. 3 is a plan view of an integrated circuit chip included in the semiconductor device.

FIGS. 1 and 2 illustrate cross sections of a semiconductor device 2 according to the present embodiment. FIG. 3 is a plan view of an integrated circuit chip 4 included in the semiconductor device 2. FIG. 1 is a cross section of the semiconductor device 2 along a straight line (line I-I depicted in FIG. 3) passing through spacers 12. Also, FIG. 2 is a cross section of the semiconductor device 2 along a straight line (line II-II in FIG. 3) passing through IC pad electrodes 24.

As illustrated in FIGS. 1 and 2, the semiconductor device 2 according to the present embodiment includes the integrated circuit chip 4, a stack member 6 and a sealing material 8.

On the surface of the integrated circuit chip 4, an integrated circuit such as a memory and a logic circuit is formed (the same is applicable to another integrated circuit chip described later). As illustrated in FIG. 1, the integrated circuit chip 4 is mounted on a substrate (package substrate) 10 by a conductive paste 32 at the rear face side of the integrated circuit chip 4.

Further, as illustrated in FIGS. 1 and 3, the integrated circuit chip 4 includes a plurality of spacers 12 directly adhered to the surface thereof. The all spacers have an identical height. As the adhered positions of the spacers 12, outer circumference portions (particularly, four corners) of the integrated circuit chip 4 are preferable, as illustrated in FIG. 3.

On a surface on the substrate side of the stack member 6 (hereafter referred to as lower surface), an adhesive layer (adhesive agent layer) 14 is provided. By the adhesive layer 14, the stack member 6 is adhered to the upper portion of the plurality of spacers 12. Thus, the adhesive layer 14 is separated from the integrated circuit chip 4.

The stack member 6 is a heat sink, for example. The adhesive layer 14 is a thermoplastic resin film of, for example, HIATTCH (product name) manufactured by Hitachi Chemical Co., having a thickness of 10-100 μm.

The sealing material 8 seals (that is, fills) at least between the integrated circuit chip 4 and the adhesive layer 14. The sealing material 8 is a thermosetting resin (a resin whose main component is an epoxy resin), for example.

Figure 4:
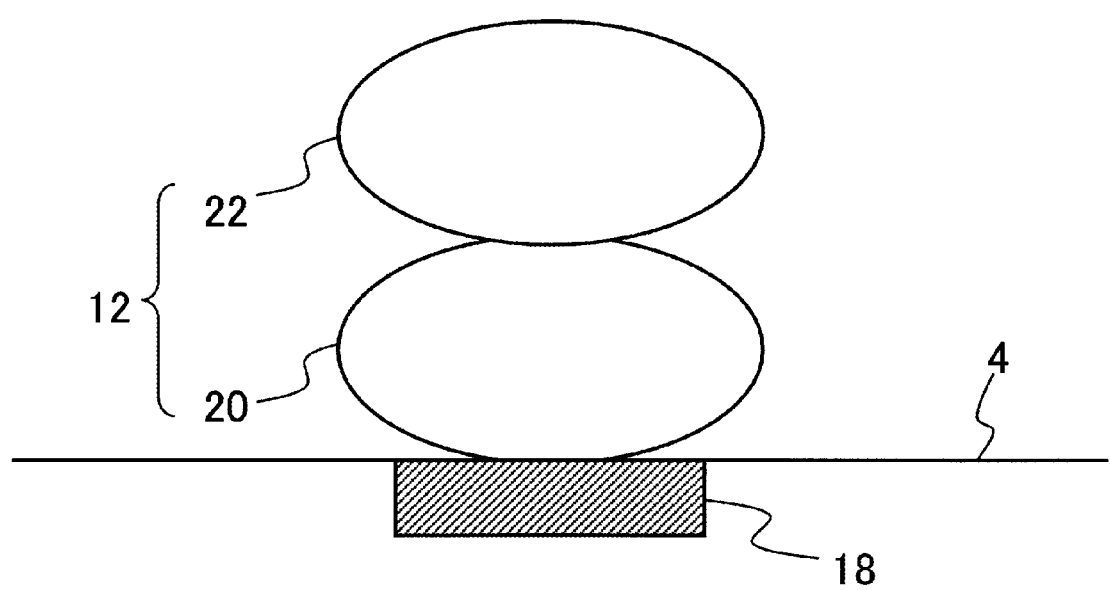
FIG. 4 is a side view illustrating one example of a spacer.

FIG. 4 is a side view illustrating one example of a spacer 12. The spacer 12 includes a first ball (Au ball, for example) 20 directly adhered to an adhesive pad (Al pad, for example) 18 provided on the surface of the integrated circuit chip 4 and a second ball (Au ball, for example) 22 directly adhered onto the first ball 20, as an example. Preferably, the first ball 20, the second ball 22 and the adhesive pad 18 are metal.

Here, the spacer 12 is not limited to such two-layered balls as illustrated in FIG. 4. The spacer 12 may be any protrusion (bump spacer) provided on the surface of the integrated circuit chip 4.

The first ball 20 and the second ball 22 are ball-shaped swellings formed at the tip of a bonding wire (Au wire etc.) by discharge. By applying ultrasonic vibration to the swellings while being pressed onto the adhesive pad 18, the first ball 20 is adhered to the surface of the integrated circuit chip 4.

When ultrasonic vibration is applied to the first ball 20, an oxide on the surface of the adhesive pad 18 contacting to the first ball 20 is broken. As a result, the first ball 20 is directly adhered to the adhesive pad 18 without the adhesive layer (adhesive agent layer) lying between them. Similarly, by applying ultrasonic vibration to the second ball 22 while pressing the second ball 22 onto the first ball 20, the second ball 22 is directly adhered to the first ball 20.

As such, in the semiconductor device 2, there is no adhesive layer attached to the surface of the integrated circuit chip 4. Thus, according to the present embodiment, a problem caused by the adhesive layer attached to the surface of the integrated circuit chip is prevented.

The problem caused by the adhesive layer attached to the surface of the integrated circuit chip is disconnection of wires on the integrated circuit chip. As the sealing material 8, a resin having a thermal expansion coefficient substantially the same as that of the integrated circuit chip 4 (semiconductor chip) is used. In contrast, the thermal expansion coefficient of the resin for use in the adhesive layer greatly differs from the thermal expansion coefficient of the integrated circuit chip 4.

Now, a semiconductor device having the stack member 6 adhered to the integrated circuit chip 4 is considered. When such semiconductor device is exposed at high temperature, stress is caused by a difference in the thermal expansion coefficients between the integrated circuit chip 4 and the adhesive layer 14.

The integrated circuit chip 4 and the adhesive layer 14 have greatly different elastic coefficients, not only different thermal expansion coefficients. By this, the stress caused by the difference of the thermal expansion coefficients is concentrated on an interface between the integrated circuit chip 4 and the adhesive layer 14, and disconnects the wiring of the integrated circuit chip 4. Here, one of cases in which the semiconductor device is exposed to high temperature is a reflow process to mount the semiconductor device on the printed substrate.

Another problem caused by the adhesive layer is so-called a popcorn phenomenon. To attach the adhesive layer to the surface of the integrated circuit chip, first, a stack member having the adhesive layer disposed on the rear face thereof is mounted on the integrated circuit chip. Thereafter, by pressing the stack member onto the integrated circuit chip while the adhesive layer is heated, the stack member is attached to the integrated circuit chip.

When mounting the stack member on the integrated circuit chip, a minute gap is produced between the integrated circuit chip and the adhesive layer. When the adhesive layer is softened by heat, air left in the gap is taken into the adhesive layer, and thereby a void is produced.

Now, in the sealing material of the semiconductor device, a small amount of moisture-absorbable substance is included. With this, the sealing material gradually absorbs moisture in the atmosphere after the integrated circuit chip is sealed.

When the semiconductor device is heated again for a reflow process etc., a portion of moisture absorbed in the sealing material is concentrated upon the void in the adhesive layer. As a result, pressure in the void increases, and the semiconductor device is exploded by the increased pressure.

Such problems similarly occur in a semiconductor device like a stacked IC, having spacers adhered to the integrated circuit chip by the adhesive layer.

In contrast, in the semiconductor device 2 according to the present embodiment, there is no adhesive layer attached to the surface of the integrated circuit chip 4. Therefore, according to the present embodiment, it is possible to prevent such problems caused by the adhesive layer attached to the surface of the integrated circuit chip 4.

Now, as illustrated in FIG. 2, IC pad electrodes 24 are provided on the surface of the integrated circuit chip 4. To each IC pad electrode 24, a tip portion of a bonding wire 26 is adhered. The other end of the bonding wire 26 is adhered to a substrate surface-side pad electrode (not illustrated) provided on the surface of the substrate 10.

In addition to the substrate surface-side pad electrode, the substrate 10 includes substrate rear face-side pad electrode (not illustrated), via conductor and solder ball 28. The via conductor is a conductor filled into a via provided at the substrate 10 to connect the substrate surface-side pad electrode to the substrate rear face-side pad electrode. The solder ball 28 is adhered to the substrate rear face-side pad electrode. Here, solder balls 28 are disposed two dimensionally on the rear face of the substrate 10.

A signal input into the semiconductor device 2 is transmitted to the integrated circuit chip 4 through a path connecting each solder ball 28 to the bonding wire 26. Also, a signal generated by the integrated circuit chip 4 is transmitted through the above path. Namely, the semiconductor device 2 is a BGA (ball grid array) semiconductor device.

As illustrated in FIG. 3, the tip portion 30 of each bonding wire 26 is processed into a ball-shaped swelling (hereafter referred to as wire ball). The wire ball 30 is adhered (connected) to an IC pad electrode 24 (refer to FIG. 2). Further, to an adhesive pad 18 (refer to FIG. 1), a first metallic ball 20 included in a spacer 12 is adhered.

The size (particularly the size in the direction perpendicular to the substrate 10) of the first metallic ball 20 is larger than the size of the wire ball 30. The same is applicable to the second metallic ball 22. Therefore, the size (particularly the size in the direction perpendicular to the substrate 10) of the spacer 12 is larger than the wire ball 30. In other words, each height of the plurality of spacers 12 is greater than the height of the bonding wire 26 relative to the upper face of the integrated circuit chip 4.

Therefore, as illustrated in FIG. 2, it is difficult for a loop of the bonding wire 26 to contact to the stack member 6. Because of this, in the semiconductor device 2 according to the present embodiment, a short circuit of bonding wires 26 via the stack member 6 (for example, heat sink) hardly occurs.

Further, according to the present embodiment, each portion of the bonding wires 26 (a top of the wire loop and the vicinity thereof) is buried into the adhesive layer 14, as illustrated in FIG. 2. By this, in the molding process described later, the bonding wires 26 are not displaced by the mold resin. Therefore, the bonding wires 26 do not contact each other. Accordingly, a short circuit between the bonding wires hardly occurs.

If a gap between the bonding wires 26 becomes narrow, a short circuit between wires is apt to occur by distortion of the bonding wire 26 when the resin is poured. However, because each bonding wire 26 is fixed by burying the upper portion of the bonding wire 26 into the adhesive layer 14, a short circuit does not occur between the bonding wires 26.

(2) Manufacturing Method

FIGS. 5A through 7B are process cross sections illustrating a manufacturing method of the semiconductor device 2 according to the present embodiment. Hereafter, the manufacturing method of the semiconductor device 2 will be described according to FIGS. 5A through 7B.

Figure 5A:
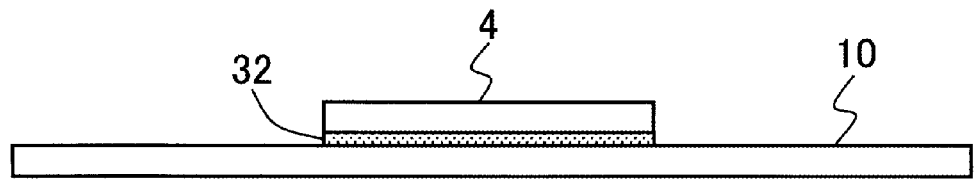
FIGS. 5A-5D are process cross sections illustrating a manufacturing method of the semiconductor device according to the embodiment 1.

(i) Die Bonding Process (FIG. 5A)

First, to the substrate 10 having a conductive paste 32 coated thereon, the integrated circuit chip 4 is adhered by scrubbing. By this, the integrated circuit chip 4 is adhered to the substrate 10 at the rear face side of the integrated circuit chip 4.

Figure 5B:
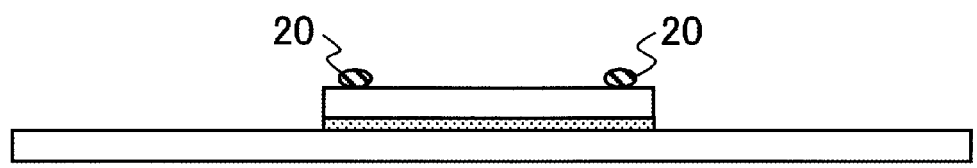
Figure 5C:
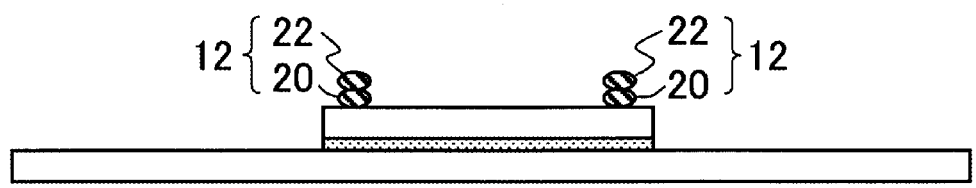

(ii) Spacer Formation Process (FIGS. 5B and 5C)

First, from a capillary (not illustrated) of a wire bonding device, the tip of a bonding wire (Au wire, for example) is ejected. By melting the bonding wire tip by discharge, a first ball 20 is formed.

While the first ball 20 is pressed onto an adhesive pad 18 disposed on the surface of the integrated circuit chip (refer to FIG. 1), ultrasonic vibration is applied to the first ball 20. By this, an oxide on the surface of the adhesive pad 18 is broken, so that the first ball 20 is directly adhered to the adhesive pad, as illustrated in FIG. 5B. At this time, the first ball 20 and the adhesive pad 18 are bonded by intermetallic bond.

Next, the tip of the bonding wire extending from the first ball 20 is separated from the first ball 20 by discharge. By this discharge, a new first ball 20 is formed.

According to the aforementioned procedure, a newly formed first ball 20 is directly adhered to another adhesive pad 18. By the repetition of the above operations, the first balls 20 are adhered to all of the adhesive pads 18.

When separating the bonding wire from the finally adhered first ball 20, a new ball is formed at a tip of the bonding wire. The newly formed ball is adhered to the first ball 20 as a second ball 22. By this, as illustrated in FIG. 5C, each spacer 12 is formed. By repeating the above operations, the second balls are adhered to all of the first balls. By the above procedure, the plurality of spacers 12 are directly adhered to the surface of the integrated circuit chip 4.

Figure 5D:
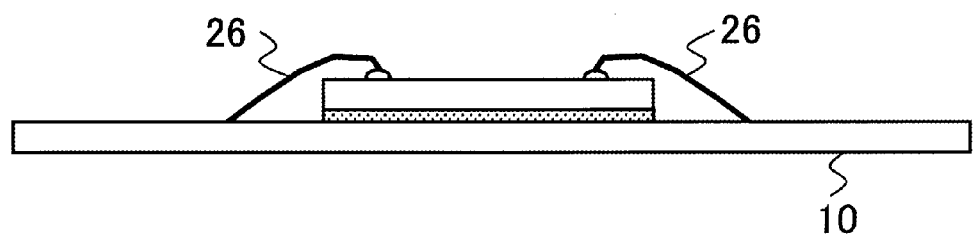

(iii) Wire Bonding Process (FIG. 5D)

Next, each end of bonding wires is adhered to the IC pad electrode 24 (refer to FIG. 2) provided on the surface of the integrated circuit chip 4. Further, to the substrate surface-side electrode pad (not illustrated) of the substrate 10, the other end of the bonding wire 26 is connected.

Figure 6A:
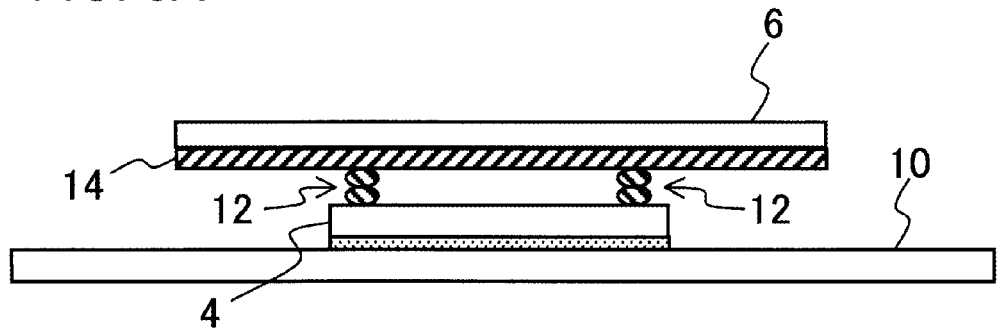

(iv) Mounting Process (FIG. 6A)

A stack member 6 having a thermoplastic adhesive layer 14 (for example, an adhesive film) disposed on the substrate side is mounted on the spacers 12 directly adhered to the surface of the integrated circuit chip 4.

Figure 6B:
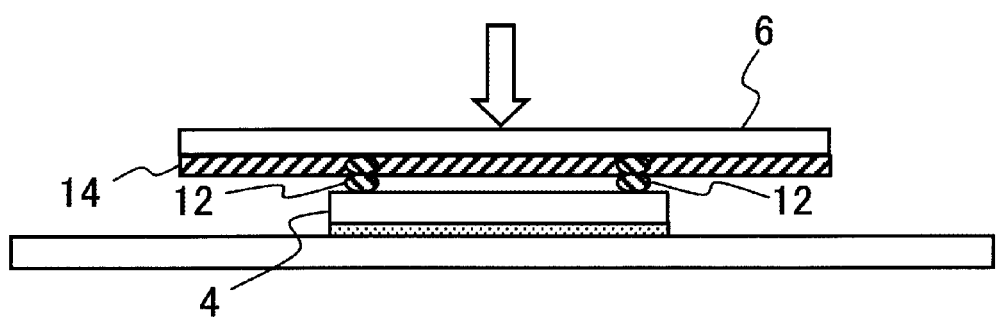
Figure 6C:
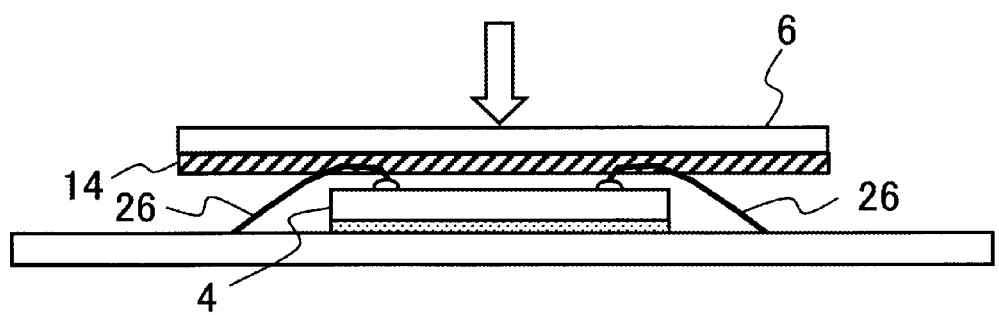

(v) Adhesion Process (FIGS. 6B and 6C)

While the adhesive layer 14 is heated, the stack member 6 mounted on the spacers 12 is pressed onto the spacers 12. At this time, for an example, the substrate 10 having the integrated circuit chip 4 disposed thereon and the stack member 6 are heated in an oven etc., together with the adhesive layer 14.

By the above heating, the thermoplastic adhesive layer 14 is softened. In this state, if the stack member 6 is pressed onto the spacers 12, the spacers 12 and the bonding wires 26 are pushed into the adhesive layer 14 (FIGS. 6B and 6C).

Here, FIG. 6B illustrates a process cross section along the straight line (line I-I in FIG. 3) passing through the spacers 12. Also, FIG. 6C illustrates a process cross section along the straight line (line II-II in FIG. 3) passing through the IC pad electrodes 24.

Thereafter, when the adhesive layer 14 returns to the room temperature, the adhesive layer 14 is cured and the upper portion of each spacer 12 and a portion of each bonding wire 26 are buried into the adhesive layer 14.

Figure 7A:
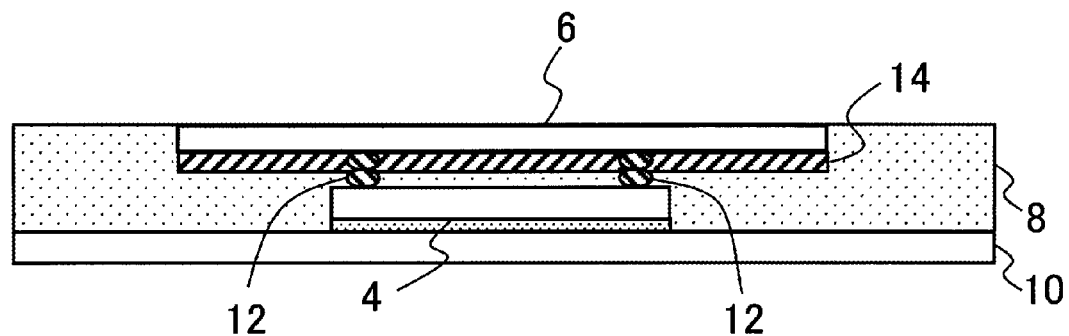
FIGS. 7A-7B are process cross sections illustrating the manufacturing method of the semiconductor device according to the embodiment 1.

(v) Molding Process (FIG. 7A)

Next, the substrate 10 having the stack member 6 adhered to the spacers 12 is mounted on a resin sealing mold (not illustrated). An epoxy resin is injected into the mold, thereafter the injected resin is cured by heating. By this, the integrated circuit chip 4 is sealed by a sealing material 8. Thereafter, the mold is detached.

On injecting the resin into the mold, there is a risk that the bonding wires 26 are displaced by the resin, resulting in contacting to each other. However, according to the present embodiment, because each top of the loops of the bonding wires 26 and the vicinity thereof are buried into the adhesive layer 14, the bonding wires 26 do not contact easily.

Figure 7B:
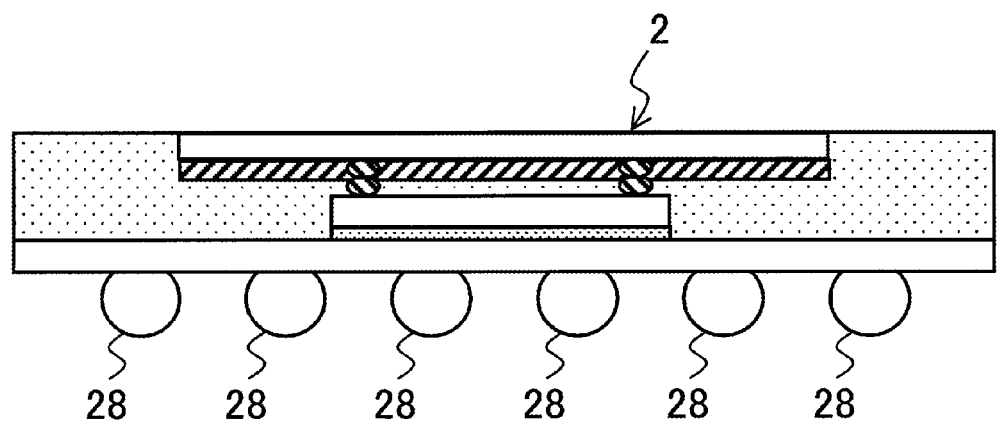

(vi) Ball Mounting Process and Cutoff Process (FIG. 7B)

After the resin-sealed semiconductor device 2 is detached from the mold, solder balls 28 are loaded on the substrate rear face-side pad electrodes formed on the rear face of the substrate 10. Finally, by cutting off the substrate 10, the semiconductor device 2 is formed into pieces.

(3) Deformation Example

Figure 8:
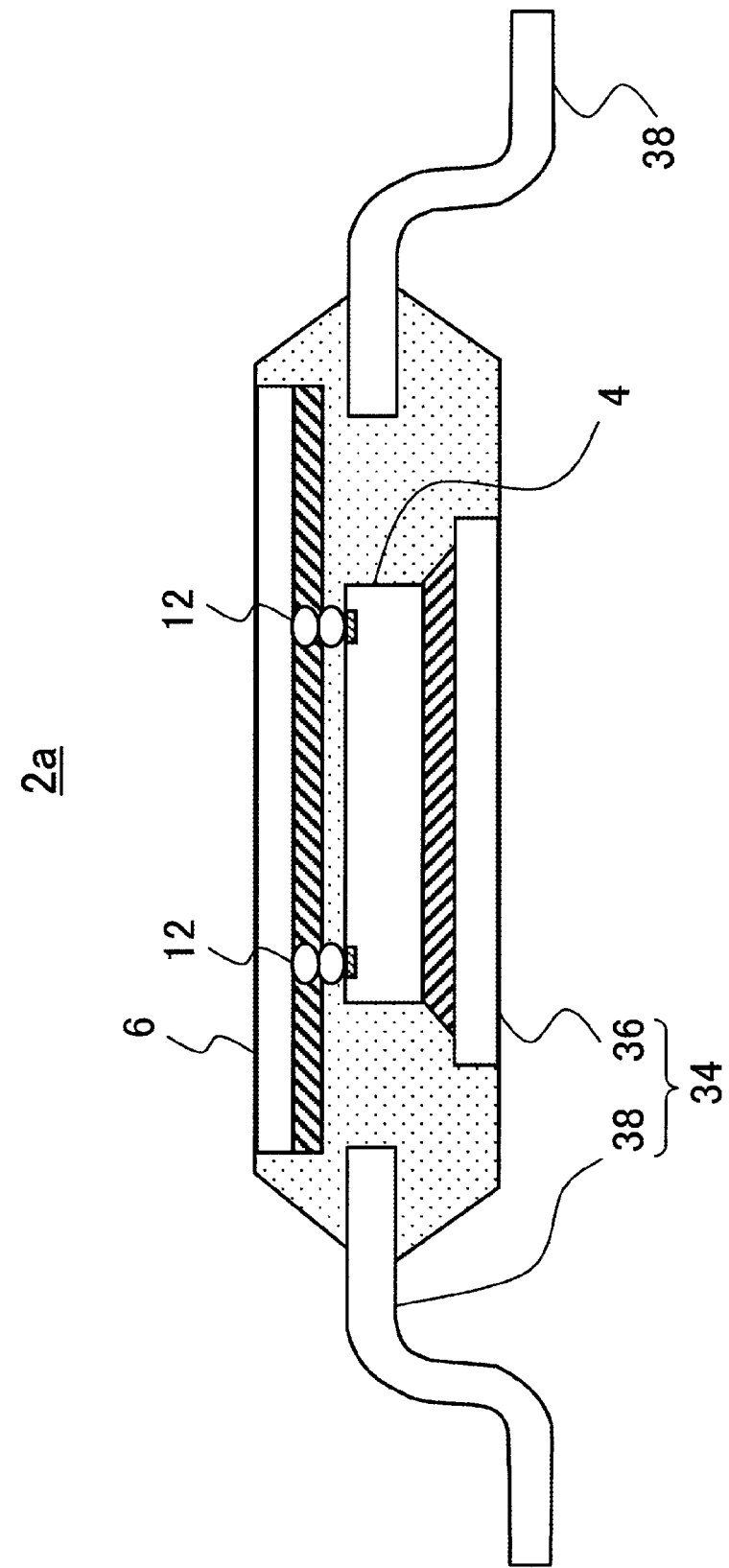
FIG. 8 is a cross section illustrating a deformation example according to the embodiment 1.
Figure 9:
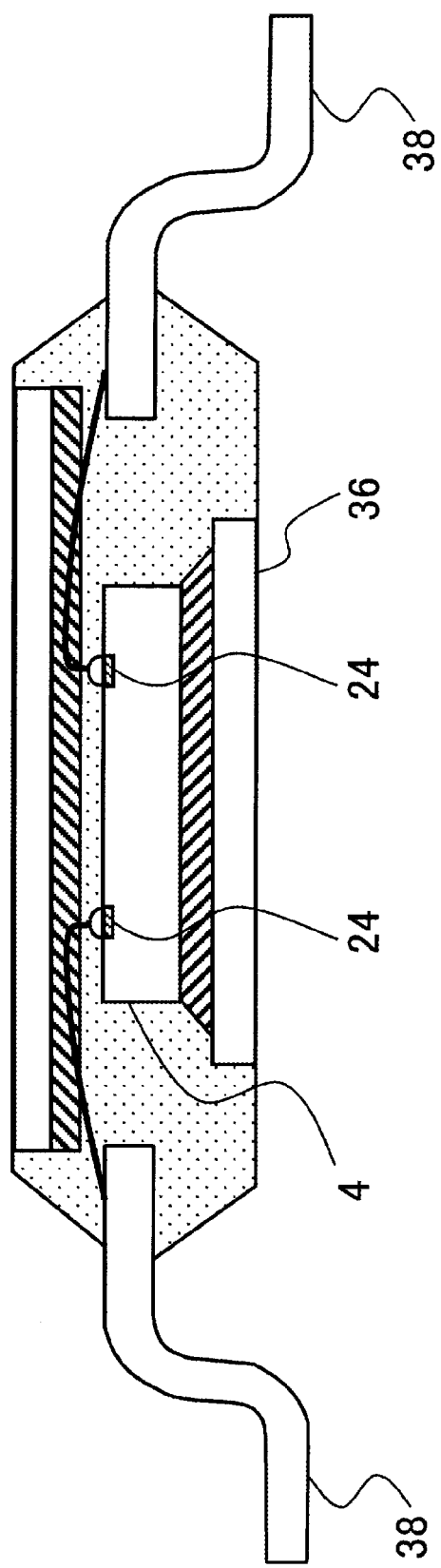
FIG. 9 is a cross section illustrating the deformation example according to the embodiment 1.

FIGS. 8 and 9 are cross sections illustrating a deformation example 2a according to the present embodiment. FIG. 8 is a cross section along a straight line passing through spacers 12. FIG. 9 is a cross section along a straight line passing through IC pad electrodes 24.

As illustrated in FIG. 8, an integrated circuit chip 4 in the present deformation example 2a is mounted on a die pad (substrate) 36 of a lead frame 34. Further, as illustrated in FIG. 9, each IC pad electrode 24 of the integrated circuit chip 4 is adhered to a lead 38. Other portions in the deformation example 2a have substantially identical structures to the semiconductor device 2 illustrated in FIGS. 1 through 3.

Figure 10:
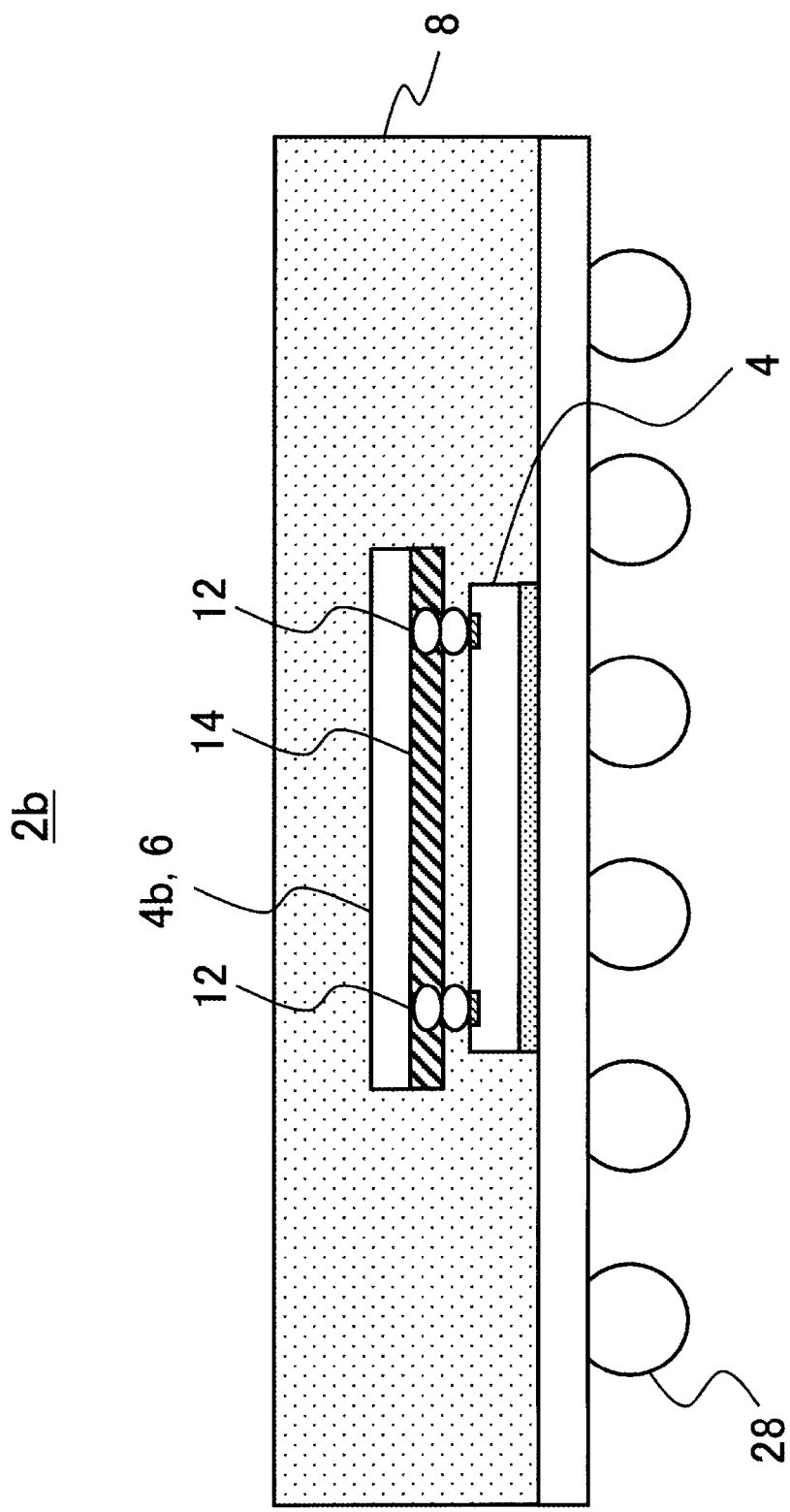
FIG. 10 is a cross section illustrating another deformation example of the embodiment 1.
Figure 11:
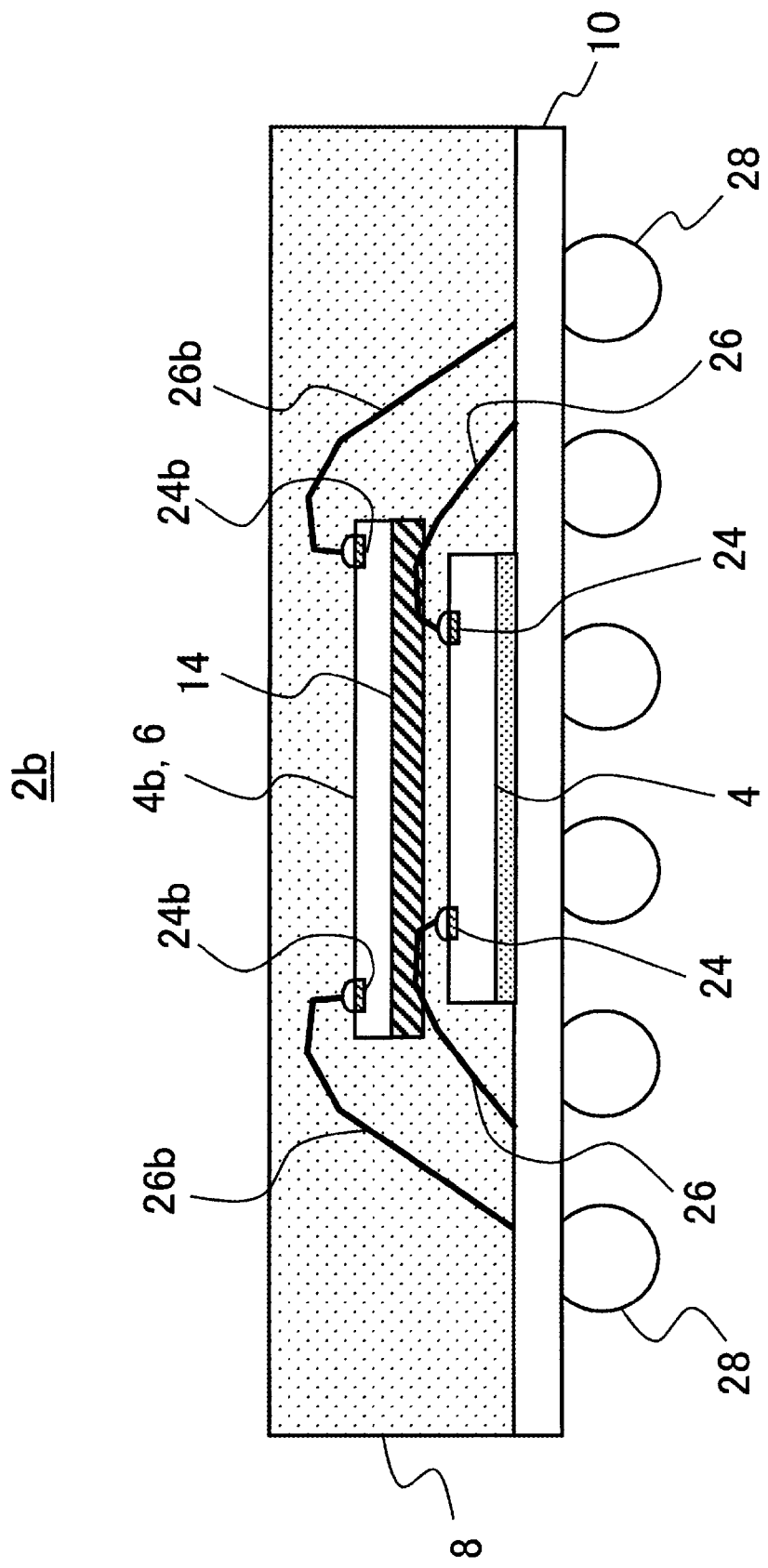
FIG. 11 is a cross section illustrating the another deformation example of the embodiment 1.

FIGS. 10 and 11 are cross sections illustrating another deformation example 2a of the present embodiment. FIG. 10 is a cross section along a straight line passing through spacers 12. FIG. 11 is a cross section along a straight line passing through IC pad electrodes 24.

In the semiconductor device 2 described by reference to FIGS. 1 through 3, the stack member 6 is a heat sink. In contrast, a stack member 6 in the present deformation example 2b is an integrated circuit chip 4b. Namely, the semiconductor device in the present deformation example is a stacked IC.

As illustrated in FIG. 11, a tip portion of each bonding wire 26b is adhered to each IC pad electrode 24b included in the integrated circuit chip 4b (stack member). To the other end of the bonding wire 26b, a substrate surface-side pad electrode (not illustrated) provided on the surface of a substrate 10 is adhered (connected). Similarly, to IC pad electrodes 24 of an integrated circuit chip 4, other substrate surface-side pad electrodes are adhered (connected) respectively.

To the substrate surface-side pad electrodes, a wiring circuit provided on the substrate 10 is connected. Through the wiring circuit, the integrated circuit chip 4 in the first layer is connected to the integrated circuit chip 4b (stack member) in the second layer. Also, each substrate rear face-side pad electrode having a solder ball 28 adhered thereto is connected to the above wiring circuit.

Different from the semiconductor device 2 illustrated in FIGS. 1 and 2, in the present deformation example 2b, the overall stack member 6 (integrated circuit chip 4b) is sealed by a sealing material 8. This aims to protect the stack member 6 (integrated circuit chip 4b). Other portions of the present deformation example 2b include substantially identical structures to the semiconductor device 2 illustrated in FIGS. 1 and 2.

Embodiment 2

Figure 12:
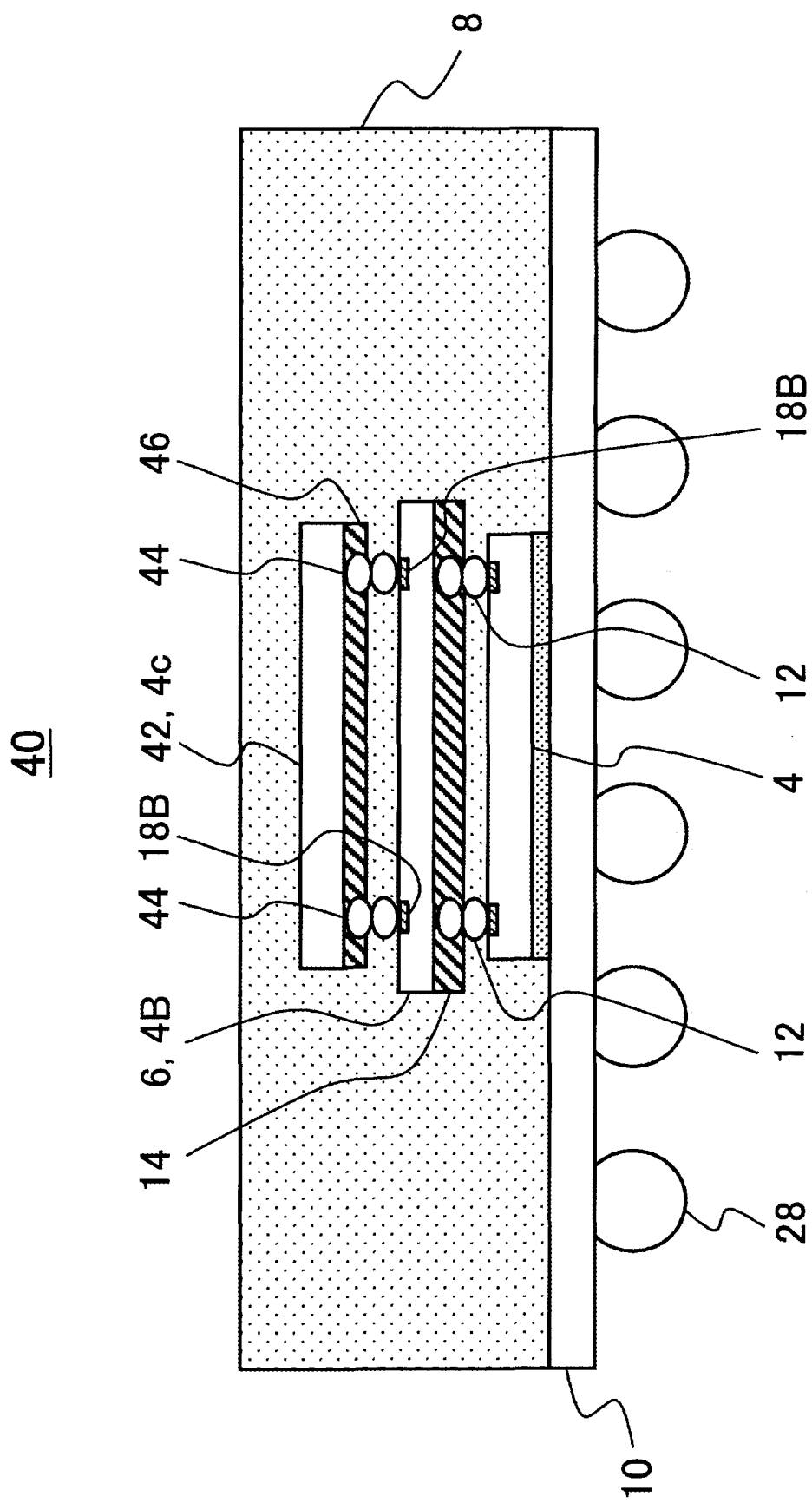
FIG. 12 is a cross section of a semiconductor device according to the embodiment 2.
Figure 13:
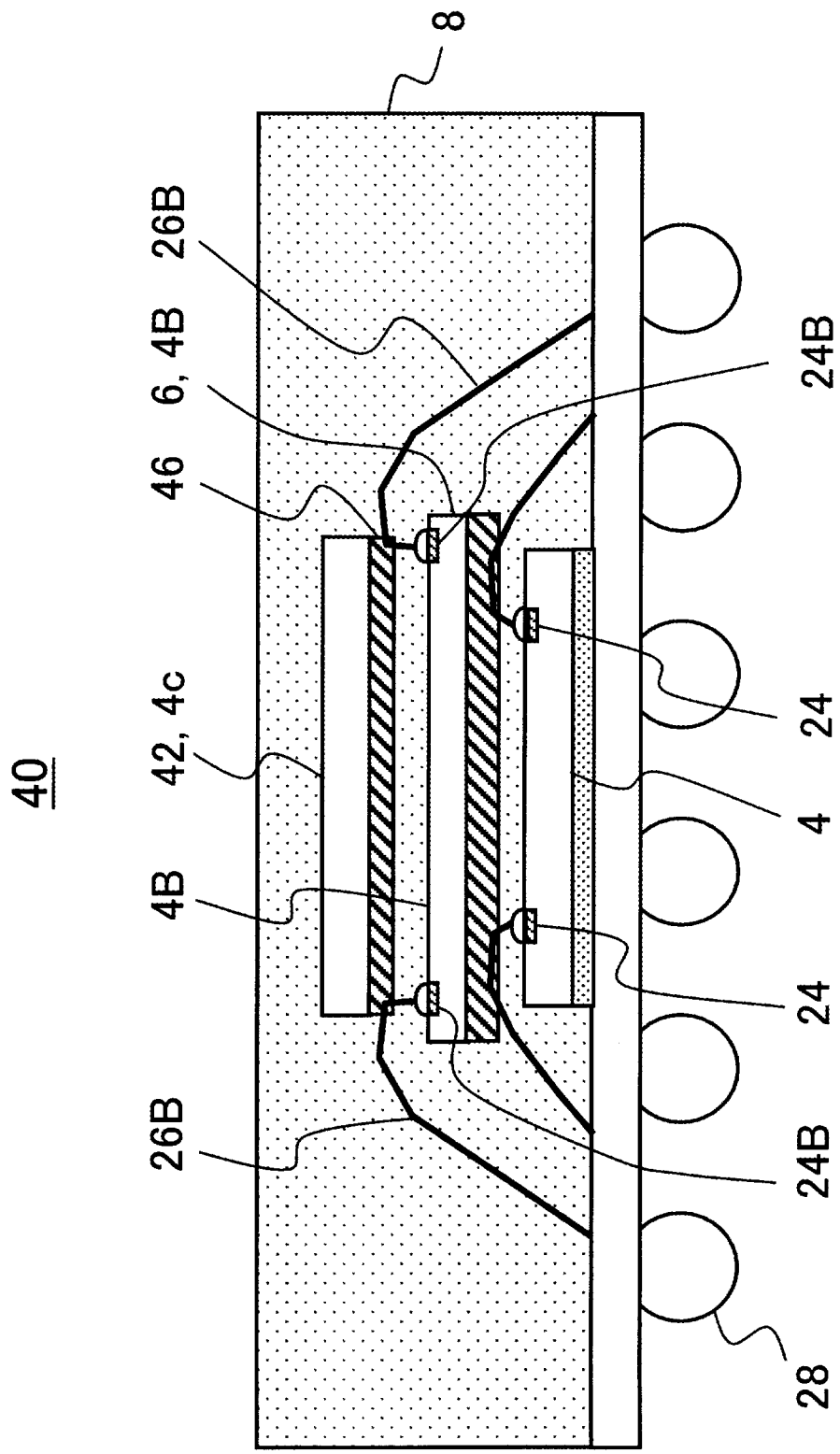
FIG. 13 is a cross section of the semiconductor device according to the embodiment 2.
Figure 14:
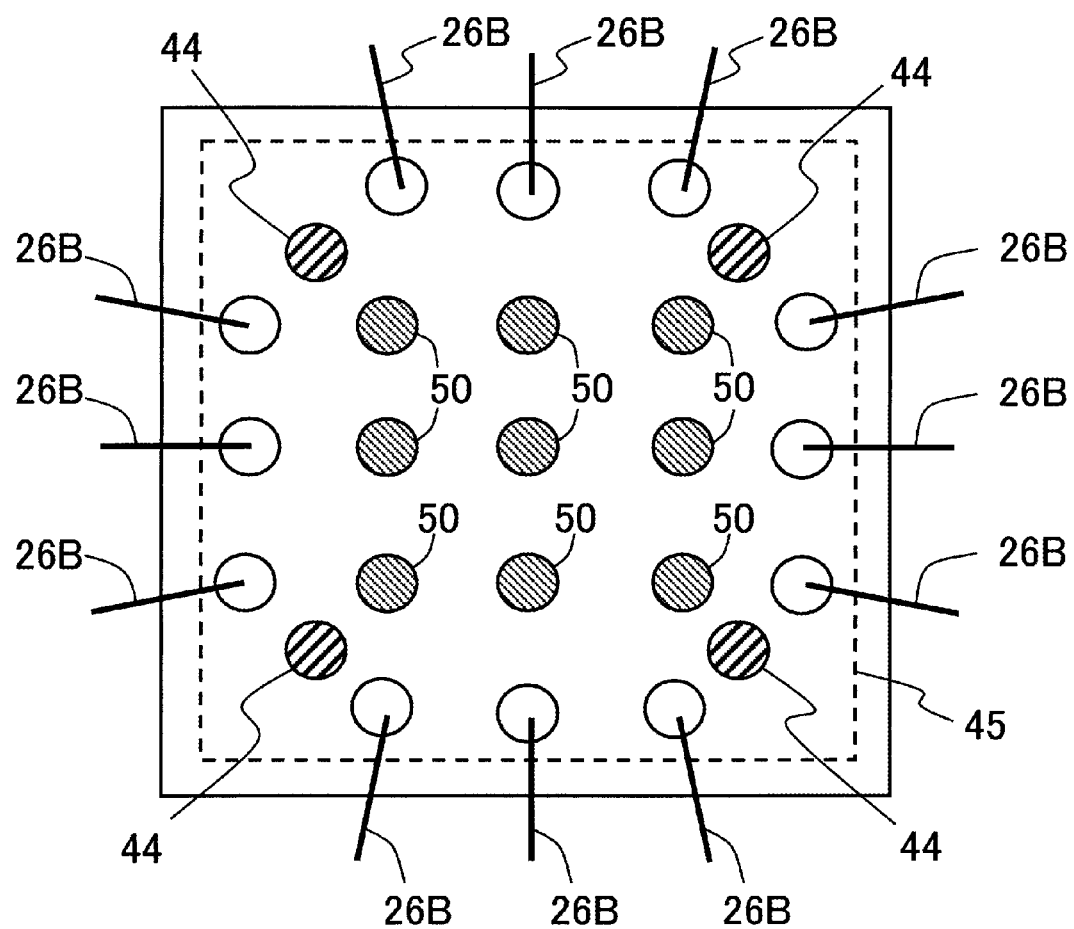
FIG. 14 is a plan view of a stack member included in the semiconductor device.

FIGS. 12 and 13 are cross sections of a semiconductor device 40 according to the present embodiment. FIG. 14 is a plan view of a stack member 6 included in the semiconductor device 40. Hereafter, the semiconductor device 40 of the present embodiment will be described according to FIGS. 12 through 14. The description of portions common to the embodiment 1 will be omitted.

(1) Structure

FIG. 12 is a cross section along a straight line passing through spacers 12. FIG. 13 is a cross section along a straight line passing through IC pad electrodes 24.

The semiconductor device 40 according to the present embodiment is a semiconductor device further including an additional stack member 42 in the semiconductor device 2b (stacked IC) described by reference to FIGS. 10 and 11. Here, the additional stack member 42 is an integrated circuit chip 4c.

As described by reference to FIGS. 10 and 11, a stack member 6 is an integrated circuit chip 4B. As illustrated in FIG. 12, the integrated circuit chip (stack member) 4B includes a plurality of additional spacers 44 directly adhered to a face (hereafter referred to as upper face) of the integrated circuit chip (stack member) 4B on the opposite side to the substrate 10.

Also, the additional stack member 42 includes an additional adhesive layer (adhesive agent layer) 46 provided on a substrate-side face (hereafter referred to as lower face) of the additional stack member 42. The additional adhesive layer 46 is composed of a thermoplastic resin film, for example.

As illustrated in FIG. 12, the additional adhesive layer 46 is adhered to the upper portions of a plurality of additional spacers 44. Therefore, additional adhesive layer 46 is separated from the integrated circuit chip 4B (stack member 6).

As illustrated in FIGS. 12 and 13, a sealing material 8 seals (in other words, fills up) a gap between the integrated circuit chip 4 and the adhesive layer 14, and also seals (fills up) a gap between the integrated circuit chip 4B (stack member) and the additional adhesive layer 46. Further, as illustrated in FIG. 13, a portion of each bonding wire 26B adhered to the upper face of the integrated circuit chip 4B (stack member) is buried into the additional adhesive layer 46.

Thus, according to the semiconductor device 40 of the present embodiment, it is possible to prevent problems caused by the additional adhesive layer 46 (such as wire disconnection on the integrated circuit chip 4B) and displacement of bonding wires 26B.

FIG. 14 illustrates the upper face of the integrated circuit chip 4B (stack member). As illustrated in FIG. 14, the above-mentioned additional spacers 44 are disposed at the four corners of the integrated circuit chip 4B. Also, on the outer circumference portion of the integrated circuit chip 4B, the tip portions of the bonding wires 26B are adhered (connected). Further, on the central portion of the integrated circuit chip 4B, a plurality of array IC pad electrodes 50 arrayed in a two dimensional manner are provided.

Figure 15:
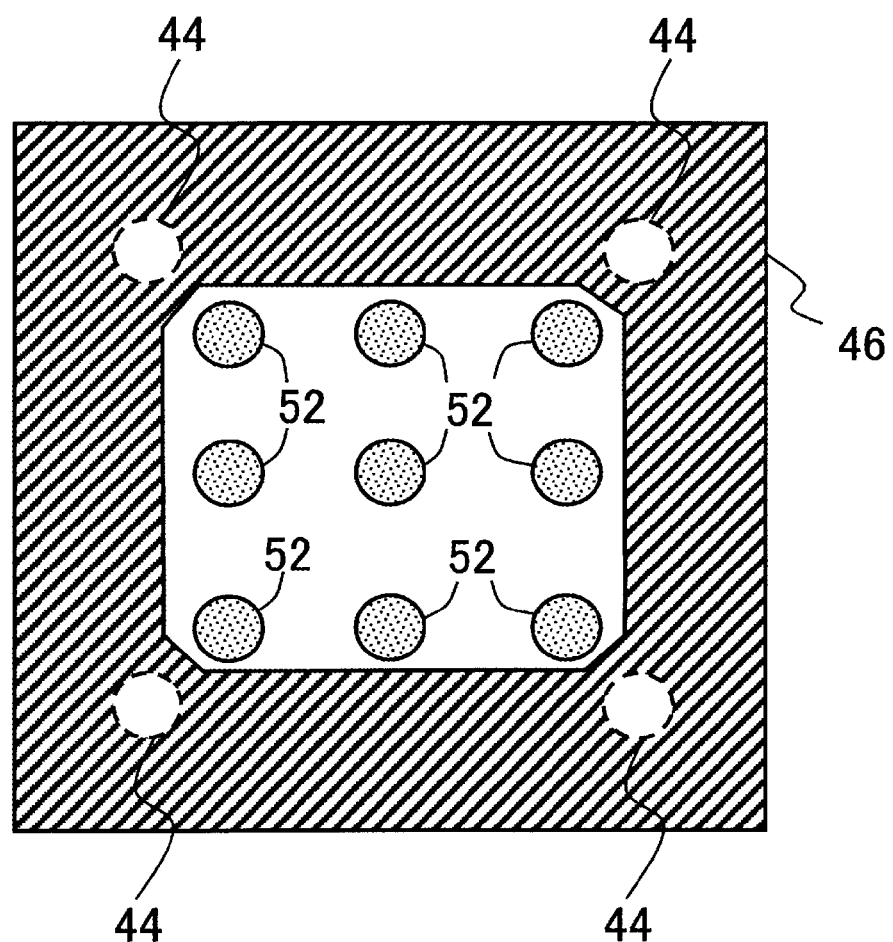
FIG. 15 is a substrate-side plan view of an additional stack member.

FIG. 15 is a substrate-side plan view of the additional stack member 42. The additional stack member 42 according to the present embodiment is an integrated circuit chip 4c that is reversed in the vertical direction. In other words, the surface of the integrated circuit chip 4c faces the surface of the integrated circuit chip 4B (stack member 6).

In FIG. 14, projection lines obtained by projecting the contour of the integrated circuit chip 4c (additional stack member 42) to the integrated circuit chip 4B (stack member 6) are illustrated with dotted lines.

As illustrated in FIG. 15, an additional adhesive layer 46 is provided on the outer circumference portion of the integrated circuit chip 4c (additional stack member 42). By the above additional adhesive layer 46, the integrated circuit chip 4c (additional stack member 42) is adhered to the additional spacers 44. In FIG. 15, the adhesion positions of the additional spacers 44 are depicted with broken lines.

Inside the additional adhesive layer 46, there are provided solder bumps 52 to be adhered to the array IC pad electrodes 50 of the integrated circuit chip 4B (stack member 6). Through the above solder bumps 52, the integrated circuit chip 4B (stack member 6) and the integrated circuit chip 4c (additional stack member 42) interchange signals.

(2) Manufacturing Method

To manufacture the semiconductor device 40, first of all, the processes up to the adhesion process (FIGS. 6B and 6C) described in the embodiment 1 are performed. In this case, the stack member 6 is the integrated circuit chip 4B.

Thereafter, each IC pad electrode 24B (refer to FIG. 13) of the integrated circuit chip 4B is connected to one of the substrate surface-side pad electrodes with a bonding wire 26B. Further, each additional spacer 44 is adhered to one of the adhesive pads 18B (refer to FIG. 12) of the integrated circuit chip 4B.

Then, the integrated circuit chip 4c (additional stack member 42) is mounted on the additional spacers 44. Next, while heating the additional adhesive layer 46 and the solder bumps 52, the integrated circuit chip 4c (additional stack member 42) is pressed onto the additional spacers 44.

By this, the integrated circuit chip 4c (additional stack member 42) is adhered (connected) to the integrated circuit chip 4B (stack member 6). Thereafter, the molding process, the boll mounting process and the cutoff process described in the embodiment 1 are carried out. Through the above processes, the semiconductor device 40 of the present embodiment is formed.

Now, the structure of each additional spacer 44 is substantially identical to the structure of each spacer 12 described by reference to FIG. 4. It may also be possible to use a ball stack structure having substantially identical structure to the additional spacer 44, in place of the solder bump 52.

Figure 16:
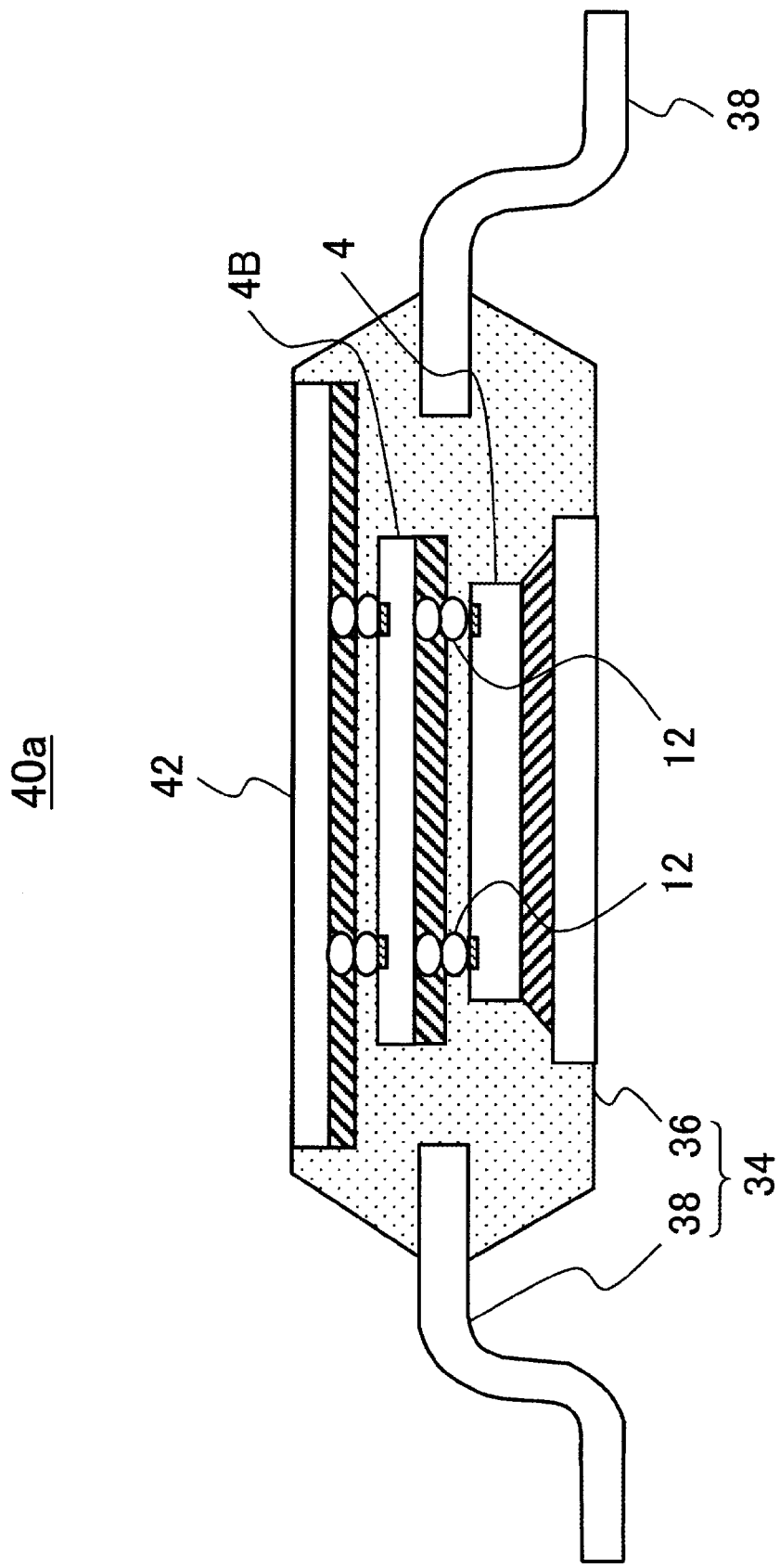
FIG. 16 is a cross section illustrating a deformation example of the embodiment 2.
Figure 17:
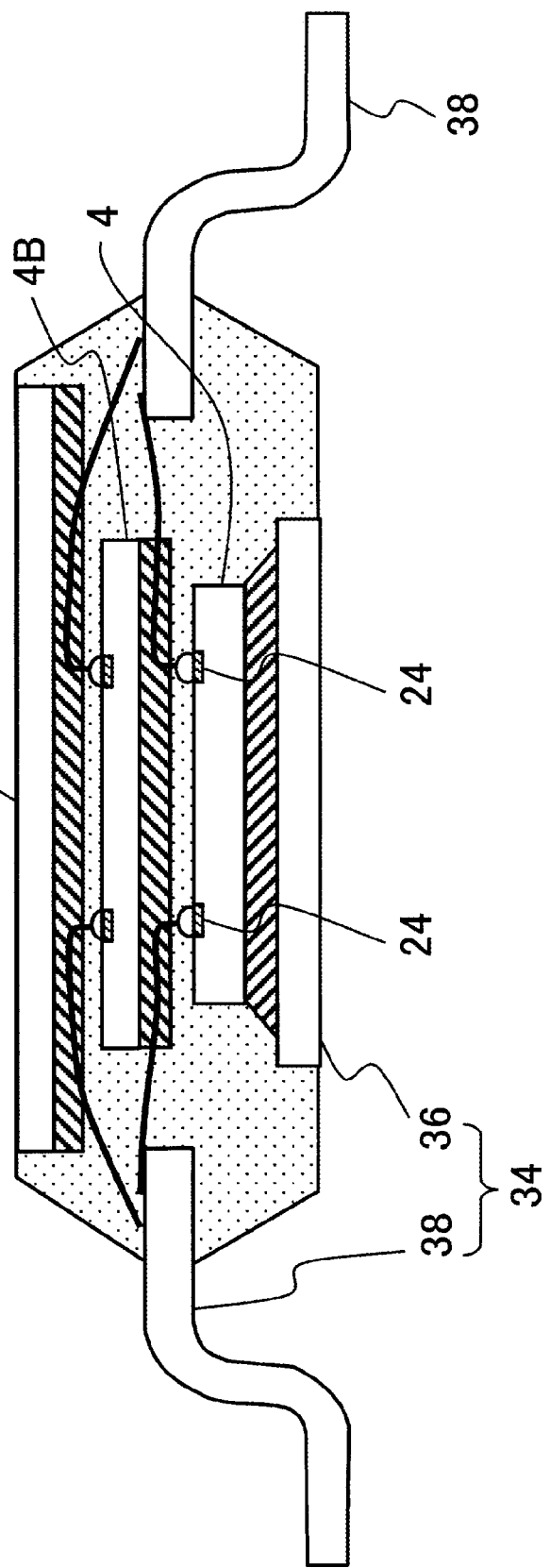
FIG. 17 is a cross section illustrating the deformation example of the embodiment 2.

FIGS. 16 and 17 are cross sections illustrating a deformation example 40a of the present embodiment. FIG. 16 is a cross section along a straight line passing through spacers 12. FIG. 17 is a cross section along a straight line passing through IC pad electrodes 24.

As illustrated in FIGS. 16 and 17, the deformation example 40a is a lead frame type semiconductor device. In the deformation example 40a, the additional stack member 42 is a heat sink. Other portions in the deformation example 40a are substantially identical to the semiconductor device 40 or the deformation example 2a of the embodiment 1.

In the embodiments described above, each spacer 12 is a stack of balls formed on the tip portion of the bonding wire, as illustrated in FIG. 4. However, the spacer 12 is not limited thereto. For example, the spacer 12 may be a metallic support.

Also, in the aforementioned embodiments, the adhesive layer and the additional adhesive layer are formed of thermoplastic adhesive films. However, the adhesive layer and the additional adhesive layer are not limited to the adhesive films. For example, the adhesive layer may be a resin paste coated on the rear face of the stack member. Similarly, the additional adhesive layer may be a resin paste coated on the rear face of the additional stack member.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
   a circuit substrate;
   a first semiconductor chip disposed on the circuit substrate;
   a plurality of first spacers disposed on the first semiconductor chip;
   a second semiconductor chip which includes a first thermoplastic adhesive agent layer on a lower face thereof and is disposed on upper portions of the plurality of spacers;
   a wire which connects the circuit substrate to the first semiconductor chip; and
   a first molded thermosetting resin which seals a gap between the first semiconductor chip and the first thermoplastic adhesive agent layer.

2. The semiconductor device according to claim 1, wherein all of the plurality of first spacers have an identical height.

3. The semiconductor device according to claim 2, wherein a portion of the wire is buried into the first thermoplastic adhesive agent layer.

4. The semiconductor device according to claim 1, further comprising:
   a plurality of second spacers disposed on the second semiconductor chip;
   a third semiconductor chip which includes a second thermoplastic adhesive agent layer on a lower face thereof and is disposed on upper portions of the plurality of second spacers; and
   a second molded thermosetting resin which seals at least a gap between the second semiconductor chip and the second thermoplastic adhesive agent layer.

5. The semiconductor device according to claim 1, wherein each of the first spacers includes a first metallic ball directly adhered to an adhesive pad disposed on a surface of the first semiconductor chip and a second metallic ball directly adhered to the first metallic ball.

6. The semiconductor device according to claim 5, wherein the wire includes a wire ball adhered to the surface of the first semiconductor chip; and
   the first metallic ball and the second metallic ball included in the first spacer is larger than the wire ball.

7. A semiconductor device comprising:
   a circuit substrate;
   a semiconductor chip disposed on the circuit substrate;
   a plurality of spacers disposed on the semiconductor chip;
   a heat sink which includes an adhesive agent layer on a lower face thereof and is disposed on upper portions of the plurality of spacers;
   a wire which connects the circuit substrate to the semiconductor chip; and
   a sealing material which seals a gap between the semiconductor chip and the adhesive agent layer.

8. A semiconductor device comprising:
   a circuit substrate;
   a first semiconductor chip disposed on the circuit substrate;
   a plurality of first spacers disposed on the first semiconductor chip;
   a second semiconductor chip which includes a first adhesive agent layer on a lower face thereof and is disposed on upper portions of the plurality of spacers;
   a wire which connects the circuit substrate to the first semiconductor chip; and
   a first sealing material which seals a gap between the first semiconductor chip and the first adhesive agent layer and of which a thermal expansion coefficient is closer to a thermal expansion coefficient of the first semiconductor chip than a thermal expansion coefficient of the first adhesive agent layer.

9. A semiconductor device comprising:
   a circuit substrate;
   a semiconductor chip disposed on the circuit substrate;
   a plurality of spacers disposed on the semiconductor chip;
   a heat sink which includes an adhesive agent layer on a lower face thereof and is disposed on upper portions of the plurality of spacers;
   a wire which connects the circuit substrate to the semiconductor chip; and a sealing material which seals a gap between the semiconductor chip and the adhesive agent layer and of which a thermal expansion coefficient is closer to a thermal expansion coefficient of the semiconductor chip than a thermal expansion coefficient of the adhesive agent layer.

* * * * *